(12) United States Patent
Thompson et al.

(10) Patent No.: US 10,791,652 B2
(45) Date of Patent: Sep. 29, 2020

(54) SYSTEMS AND METHODS FOR HEATSINK TO RAIL THERMAL INTERFACE ENHANCEMENT

(71) Applicant: Eagle Technology, LLC, Melbourne, FL (US)

(72) Inventors: Jason Thompson, Melbourne, FL (US); Bernie J. Gilley, West Melbourne, FL (US); Brandon T. Dubas, Oviedo, FL (US); Beau Guidry, Indian Harbour Beach, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 16/006,280

(22) Filed: Jun. 12, 2018

(65) Prior Publication Data

US 2019/0380225 A1    Dec. 12, 2019

(51) Int. Cl.
*H05K 7/20* (2006.01)
*H05K 5/02* (2006.01)
(Continued)

(52) U.S. Cl.
CPC ......... *H05K 7/2049* (2013.01); *H05K 5/0291* (2013.01); *H05K 7/1404* (2013.01);
(Continued)

(58) Field of Classification Search
CPC ........... H05K 7/00–186; H05K 7/2049; H05K 7/1404; H05K 7/1427; H05K 7/20509;
(Continued)

(56) References Cited

U.S. PATENT DOCUMENTS 3,278,250 A * 10/1966 Vogt ..................... A47B 88/493
                                                    312/334.12
4,508,405 A *  4/1985 Damon ................ H05K 7/1069
                                                    324/754.08
(Continued)

OTHER PUBLICATIONS

Brookstein, D., et al., "Experimental method for determining thermal resistance of heatsinks for standard electronic module applications," International SAMPE Electronics Conference, Albany Int Research Co., ISECE8. published 1994. Abstract Only.
(Continued)

*Primary Examiner* — Daniel P Wicklund
*Assistant Examiner* — Amir A Jalali
(74) *Attorney, Agent, or Firm* — Fox Rothschild LLP; Robert J. Sacco; Carol E. Thorstad-Forsyth

(57) ABSTRACT

Systems (300) and methods (1200) for inserting an electronic module in a structure. The methods comprise: sliding at least one glide mechanism on a rail of the structure or a surface of the electronic module as the electronic module is being inserted into the structure; actuating a coupler to secure the electronic module to the rail and compress a thermal interface material between the electronic module and the rail; thus causing the glide mechanism to be retracted into the electronic module or rail while the coupler is being actuated. The thermal interface material first comes in contact with the rail while the coupler is being actuated. The glide mechanism is integrated with the electronic module or the rail and is resiliently biased in a direction away from the electronic module or rail so as to partially extend out from the electronic module in a direction towards the electronic module or rail.

19 Claims, 11 Drawing Sheets

(51) Int. Cl.
*H05K 7/14* (2006.01)
*H05K 7/10* (2006.01)

(52) U.S. Cl.
CPC ....... *H05K 7/1427* (2013.01); *H05K 7/20509* (2013.01); *H05K 7/1053* (2013.01)

(58) Field of Classification Search
CPC ............. H05K 7/1053; H05K 7/20545; H05K 7/20672; H05K 5/00–03; H05K 5/091; H05K 1/0203; G06F 1/1632; G06F 1/166; G06F 1/1656; G06F 1/181–187
USPC ........ 361/702–710, 717–732, 752, 783, 756; 165/80.2, 104.31–104.33, 185; 257/E23.101, 675, 720, 723; 174/16.3, 174/260; 264/261, 263; 62/259.2; 277/652–653; 428/346, 356; 438/122
See application file for complete search history.

(56) References Cited

U.S. PATENT DOCUMENTS

| | | | |
|---|---|---|---|
| 4,751,963 A | 6/1988 | Bui et al. | |
| 4,800,956 A * | 1/1989 | Hamburgen | H01L 23/4338 165/185 |
| 4,869,680 A | 9/1989 | Yamamoto et al. | |
| 4,994,937 A * | 2/1991 | Morrison | H05K 7/1404 174/16.3 |
| 5,414,593 A * | 5/1995 | Furlan | H05K 7/1404 174/268 |
| 5,967,824 A * | 10/1999 | Neal | G06F 1/184 439/157 |
| 6,343,009 B1 * | 1/2002 | Liu | G06F 1/184 248/615 |
| 6,398,042 B1 * | 6/2002 | Tabuchi | H05K 7/1418 211/41.17 |
| 6,483,107 B1 * | 11/2002 | Rabinovitz | G06F 1/181 250/239 |
| 6,721,182 B1 | 4/2004 | Wells et al. | |
| 8,477,498 B2 * | 7/2013 | Porreca | H05K 7/20545 361/696 |
| 9,615,479 B2 * | 4/2017 | Peng | H05K 7/1489 |
| 10,042,396 B1 * | 8/2018 | Gupta | G06F 1/183 |
| 10,212,850 B1 * | 2/2019 | Wells | H05K 7/1404 |
| 2002/0114139 A1 * | 8/2002 | Bash | H05K 7/20772 361/719 |
| 2003/0161108 A1 * | 8/2003 | Bright | G02B 6/4201 361/707 |
| 2003/0169983 A1 * | 9/2003 | Branch | G02B 6/4261 385/92 |
| 2009/0083972 A1 * | 4/2009 | Colbert | H01L 23/4006 29/726 |
| 2009/0213540 A1 * | 8/2009 | Zhang | G06F 1/183 361/679.58 |
| 2010/0020514 A1 * | 1/2010 | Lee | H05K 7/1404 361/801 |
| 2011/0058335 A1 | 3/2011 | Sullivan et al. | |
| 2011/0267776 A1 | 11/2011 | Porreca et al. | |
| 2012/0236490 A1 * | 9/2012 | Xia | G06F 1/187 361/679.33 |
| 2014/0102626 A1 * | 4/2014 | Clayton | H05K 3/363 156/196 |
| 2014/0104776 A1 * | 4/2014 | Clayton | H05K 1/181 361/679.31 |
| 2014/0111070 A1 * | 4/2014 | Ehlen | H05K 7/1489 312/223.2 |
| 2014/0248028 A1 * | 9/2014 | Campbell | G02B 6/4452 385/135 |
| 2015/0168087 A1 * | 6/2015 | Kim | F28F 21/08 361/720 |
| 2016/0278521 A1 * | 9/2016 | Chen | A47B 88/57 |
| 2018/0054909 A1 * | 2/2018 | Chen | H05K 7/1489 |
| 2019/0254199 A1 * | 8/2019 | Lipp | H05K 7/20772 |

OTHER PUBLICATIONS

Extended European Search Report dated Oct. 4, 2019, Application Serial No. EP19179776.0 in the name of Eagle Technology, LLC.

\* cited by examiner

SYSTEMS AND METHODS FOR HEATSINK TO RAIL THERMAL INTERFACE ENHANCEMENT

FIELD

This document relates generally to electronic systems. More particularly, this document relates to implementing systems and methods for providing a heatsink to rail thermal interface enhancement for plug-in electronic modules.

BACKGROUND

Thermal resistance across a heatsink-rail interface is a known thermal bottleneck for plug-in Conduction Cooled Modules ("CCMs"). The thermal resistance often drives design parameters in other areas of the system. For example, the burden to provide more cooling is often placed at the system level, rather than the module level. Improved retainers can be employed to facilitate the increased cooling. However, these improved retainers are relatively expensive as compared to standard wedgelock clamping mechanisms.

Power dissipation is a critical concern for CCMs in rugged environments. CCM VITA standards are insufficient for high power dissipation (typically limited to <100 Watts, less for space applications). Modules are now being created in excess of 100 Watts. This is very challenging in both avionics and space applications. Modules are proposed for further systems that approach >200 Watts.

The current state of the art utilizes card clamps, such as retainer edge locks (commonly referred to as wedgelocks) to secure CCMs to a chassis or other structure. Such wedgelocks include, but are not limited to, a Series 260 card lock available from Calmark™ Corporation (now part of Pentair's Schroff brand) of San Diego, Calif., a Series 280 card lock available from Calmark™ Corporation, a Coollok® wedgelock available from Material Innovations, Inc. of Huntington Beach, Calif., and a wedgelock available from WaveTherm® of Raleigh, N.C. These devices use mechanical advantage (incline plane) to generate a clamping force for clamping a CCM between the wedgelock and a chassis or other structure surface.

Despite the provision of a large contact force by the wedgelocks, the materials being clamped dominate the resistance of heat transfer across the thermal interface. The resistance is a function of surface roughness, plating, flatness, etc. The thermal interface resistance range for wedgelocks (e.g., 0.3-0.6° C./Watt) can be detrimental for high power loads. This translates to a 15-30° C. temperature variation across the wedgelock's thermal interface for a 100 Watt CCM (50 W being dissipated across each interface). Additionally, the thermal interface resistance increases as the wedgelock become longer as a result of uneven wedge loading. As a result of the above limitations, wedglock implementations require well machined heatsink/chassis interfaces, which translates to higher costs.

SUMMARY

The present disclosure concerns implementing systems and methods for inserting an electronic module into a structure. The methods comprise: sliding at least one glide mechanism on a rail of the structure or on a surface of the electronic module as the electronic module is being pushed into the structure; actuating a coupler (e.g., a wedgelock) to secure the electronic module to the rail and sandwich a thermal interface material between the electronic module and the rail; and causing the glide mechanism to be retracted into the electronic module while the coupler is being actuated. The thermal interface material first comes in contact with the rail while the coupler is being actuated. The glide mechanism is integrated with the electronic module or rail. The glide mechanism is resiliently biased in a direction away from the electronic module or rail so as to partially extend out from the electronic module or rail during the sliding action.

In some scenarios, the electronic module comprises a heatsink plate coupled to a circuit board. The glide mechanism is integrated in the heatsink plate.

In those or other scenarios, the thermal interface material is coupled to the electronic module. The glide mechanism extends through the thermal interface material during module insertion/extraction. The glide mechanism is further retracted into the thermal interface material while the coupler is being actuated. The glide mechanism comprises a resiliently biased plunger, a resiliently biased ball bearing, or another assembly capable of providing spring-related performance. The glide mechanism facilitates an improvement in a thermal resistance at an interface between the electronic component and the rail. In some cases, the glide mechanism also facilitates a transfer of heat from the electronic component to the structure at the interface.

The present solution also concerns an electronic module. The electronic module comprises: a planar electronic component (e.g., a heatsink plate); a thermal interface material coupled to the planar electronic component; and at least one glide mechanism integrated with the planar electronic component at a location where the thermal interface material resides. The glide mechanism prevents the thermal interface material from generating foreign object debris when the electronic module is being inserted into or extracted from a structure.

In some scenarios, the glide mechanism is slid on a rail of the structure as the electronic module is being pushed into the structure. The glide mechanism is resiliently biased in a direction away from the electronic module to partially extend out from the electronic module in a direction towards the rail while being slid along the rail.

In those or other scenarios, the electronic module further comprises a coupler secured to the planar electronic component. The coupler is configured to: facilitate a securement of the electronic module to a rail of the structure; and/or cause the thermal interface material to be sandwiched between the electronic module and the rail when the electronic module is secured to the rail. Retraction of the glide mechanism into the electronic module is caused while the coupler is being actuated for securing the electronic module to the rail. The thermal interface material first comes in contact with the rail while the coupler is being actuated for securing the electronic module to the rail.

In those or other scenarios, the glide mechanism extends through the thermal interface material while being slid on a rail of the structure. The glide mechanism is retracted into the thermal interface material while the electronic module is being secured to the structure.

DESCRIPTION OF THE DRAWINGS

The present solution will be described with reference to the following drawing figures, in which like numerals represent like items throughout the figures.

DETAILED DESCRIPTION

Figure 1:
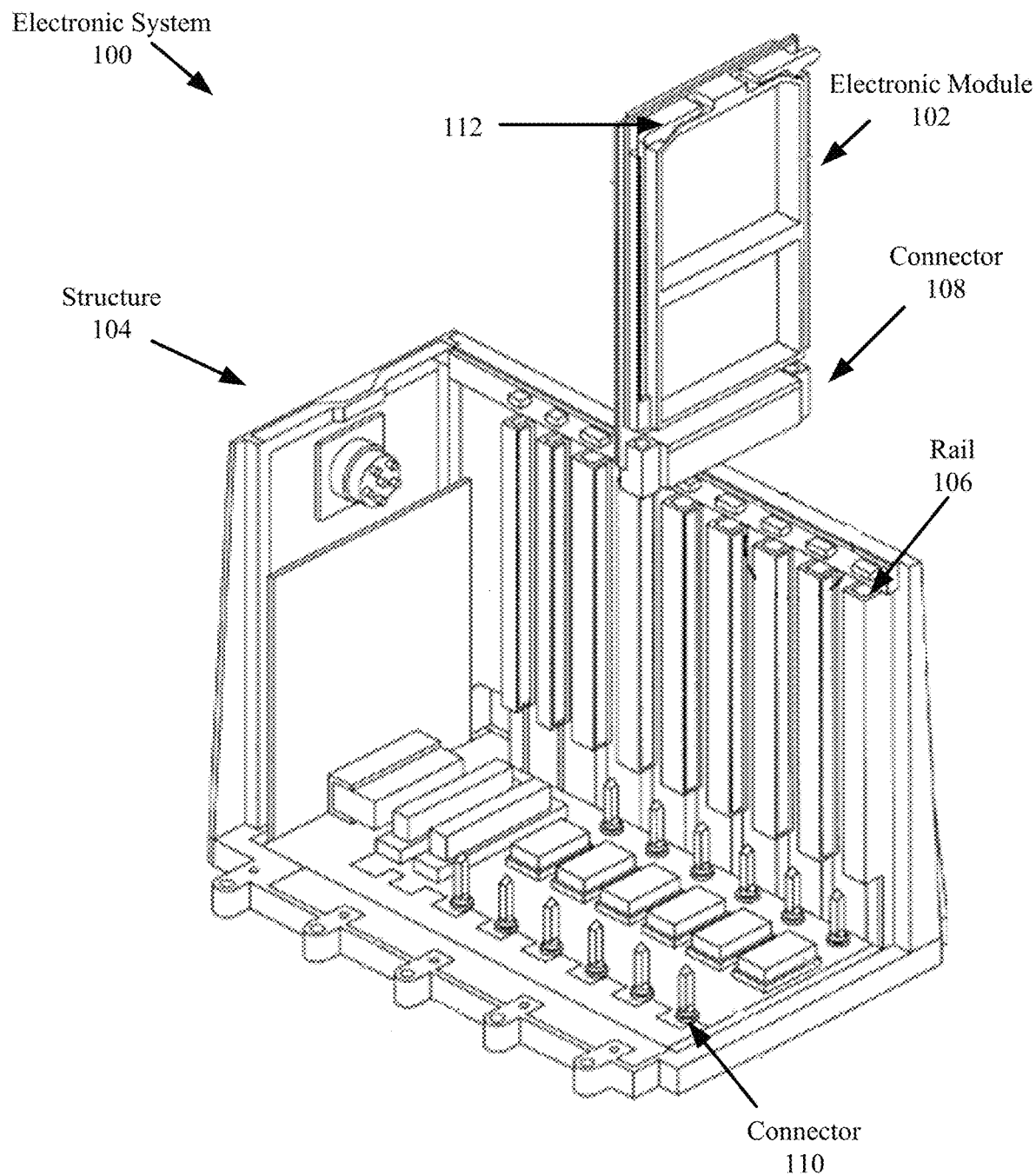
FIG. 1 is an illustration of an illustrative electronic system.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Furthermore, the described features, advantages and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

The present solution generally concerns systems and methods for providing a heatsink to rail thermal enhancement for modules. The present solution provides a heatsink to rail thermal interface for plug-in electronic modules with a thermal resistance that is improved by at least 5-15% as compared to that of conventional solutions (such as those discussed above in the Background section of this document).

The thermal enhancement is achieved by attaching (e.g., via an adhesive) a Thermal Interface Material ("TIM") on a heatsink plate or Printed Wiring Board ("PWB"); and using the TIM to circumvent surface features (e.g., surface roughness, plating, flatness, etc.) of the heatsink plate material or PWB material that have an effect on the resistance across the interface. The TIM compresses and deforms when a compression force is applied thereto (e.g., when a wedgelock is engaged to clamp the PWB between itself and a rail), whereby an interstitial bridge is provided between the abutting heatsink/PWB and rail surfaces. This TIM arrangement overcomes microscopic discontinuities and reliance on cost prohibitive machining operations. As a result, the resistance now becomes a factor of only contact pressure.

One or more spring-loaded glide mechanisms are used to protect the TIM while the electronic module is being inserted into a structure, extracted from a structure, and/or otherwise moving within the structure. The glide mechanisms are coupled to the electronic module and/or the rails. The glide mechanisms are designed to prevent binding, galling or delamination of the TIM during use of the electronic module so that foreign debris is not created in the system.

Referring now to FIG. 1, there is provided an illustration of a representative electronic system 100. The electronic system 100 comprises a structure 104 sized and shaped to receive one or more electronic modules 102. The structure 104 includes, but is not limited to, a chassis as shown, a card cage, a rack, a case, or a package. The electronic modules 102 include, but are not limited to, PWBs with a plurality of electronic components coupled thereto, traces formed thereon, and/or vias formed therethrough. The electronic components can include, but are not limited to, active components (e.g., processors and Integrated Circuit ("IC") chips) and passive components (e.g., resistors, capacitors, inductors, etc.).

When being inserted, the electronic module 102 is slid between two adjacent rails 106 of the structure 104 until the mating connectors 108, 110 fully engage each other. The electronic module 102 is retained in position using at least one wedgelock (not shown). One or more injection/ejection mechanisms 112 are provided to facilitate the extraction of the electronic module 102 from the structure. Such injection/ejection mechanisms are well known in the art, and therefore will not be described herein. Any known or to be known injection/ejection mechanism can be used herein without limitation.

The present solution is not limited to the structure architecture shown in FIG. 1. The present solution can be used with a structure having rails on opposite sidewalls. Also, the rails can extend horizontally, as opposed to vertically as shown in FIG. 1.

Figure 2:
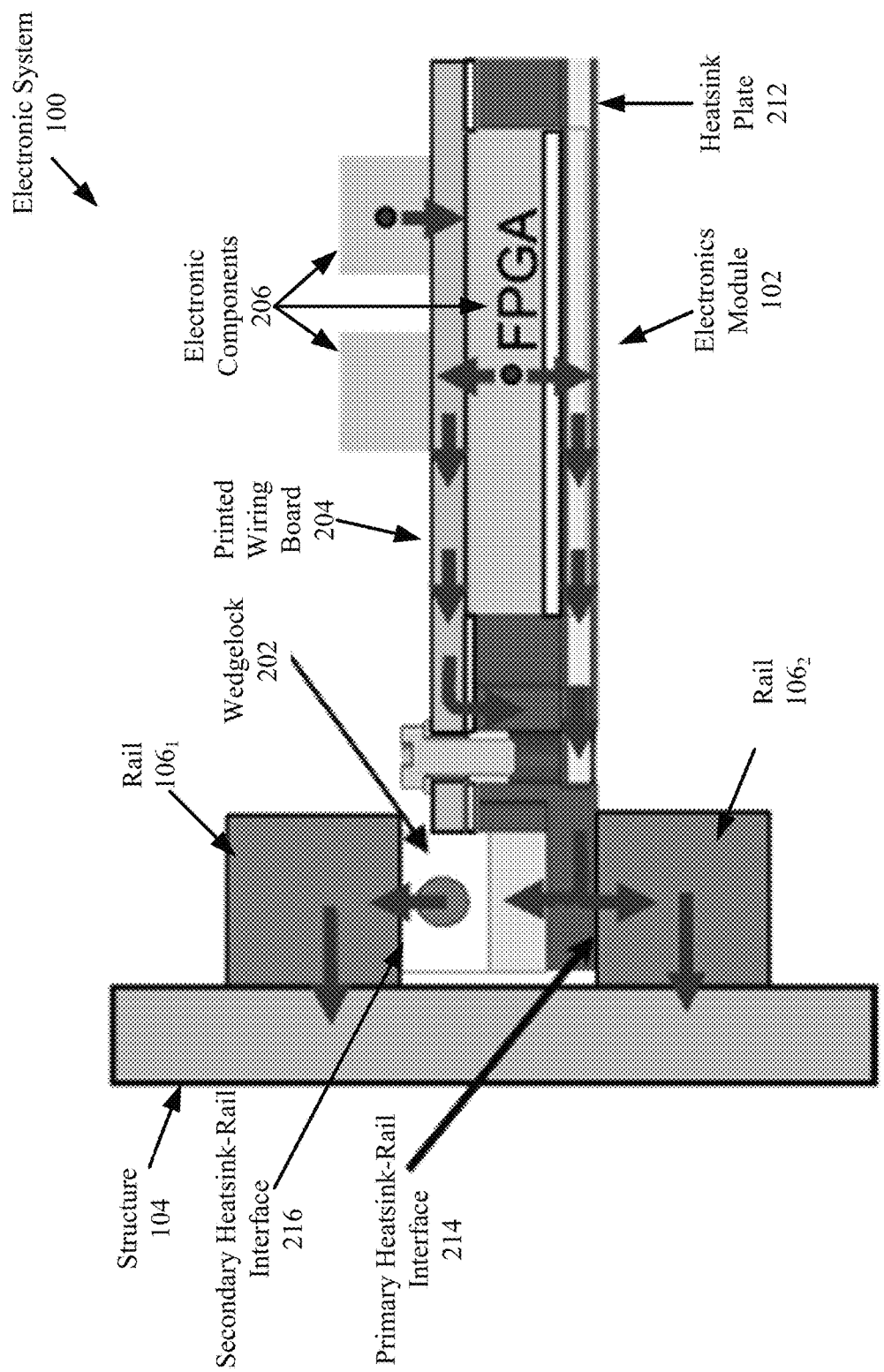
FIG. 2 is an illustration that is useful for understanding heat flow paths from a circuit board to an ambient environment.

Referring now to FIG. 2, there is provided an illustration that is useful for understanding how heat flows from the electronic module 102 to the structure 104. During operation, the electronic components 206 on the PWB 204 generate thermal energy that causes the temperature inside the structure 104 to increase. This increase in temperature can result in damage to the PWB 204 and the electronic components 206 disposed on the PWB.

The temperature in the structure 104 is decreased by dissipation or removal of heat from the PWB 204 to the surrounding structure 104 via a heatsink plate 212, a wedgelock 202, and rails 106₁, 106₂ (collectively referred to as rails 106). The components 202, 212, 106₁, 106₂ conduct heat away from the electronic components 206 on the PWB 204 to the structure 104 for transfer to the ambient environment. Two heat flow paths are provided by the arrangement shown in FIG. 2. In accordance with a first heat flow path, heat travels from the PWB 204 through the heatsink plate 212 to the primary heatsink-rail interface 214, and continues to the structure 104 via rail 106₂. In accordance with a second heat flow path, heat travels from the PWB 204 through the heatsink plate 212 and wedgelock 202 to the secondary heatsink-rail interface 216, and continues to the structure 104 via rail 106₁.

The thermal resistance at the primary thermal interface 214 depends at least in part on the amount of force exerted by the wedgelock 202 against rail 106₁. A greater contact force applied by the wedgelock 202 against the lower surface of rail 106₁ can decrease the thermal resistance at the primary thermal interface 214. Such contact force is limited in its ability to reduce thermal resistance at the primary thermal interface 214.

Despite the relatively large contact force applied by the wedgelock 202 against the lower surface of rail 106₁, the heatsink material being clamped also has an effect on the resistance to heat transfer across the primary thermal interface 214. In this regard, it should be understood that the thermal resistance is also typically a function of the physical characteristics of the clamped heatsink material (e.g., surface roughness, plating, flatness, etc.). In order to decrease this thermal resistance, the present solution employs one or more TIM elements to circumvent surface features of the heatsink plate material 212 that have an effect on the resistance across the interface.

Referring now to FIGS. 3-10D, there are provided more detailed illustrations of an electronics module 300 that are useful for understanding the present solution. Electronic module 108 of FIGS. 1-2 can be the same as or similar to electronic module 300. As such, the following discussion of electronic module 300 is sufficient for understanding electronic module 108. In FIGS. 3-10D, the electrical connector (e.g., electrical connector 110 of FIG. 1) and injection/ejection mechanism(s) (e.g., injection/ejection mechanisms 112 of FIG. 1) are not shown.

Figure 3A:
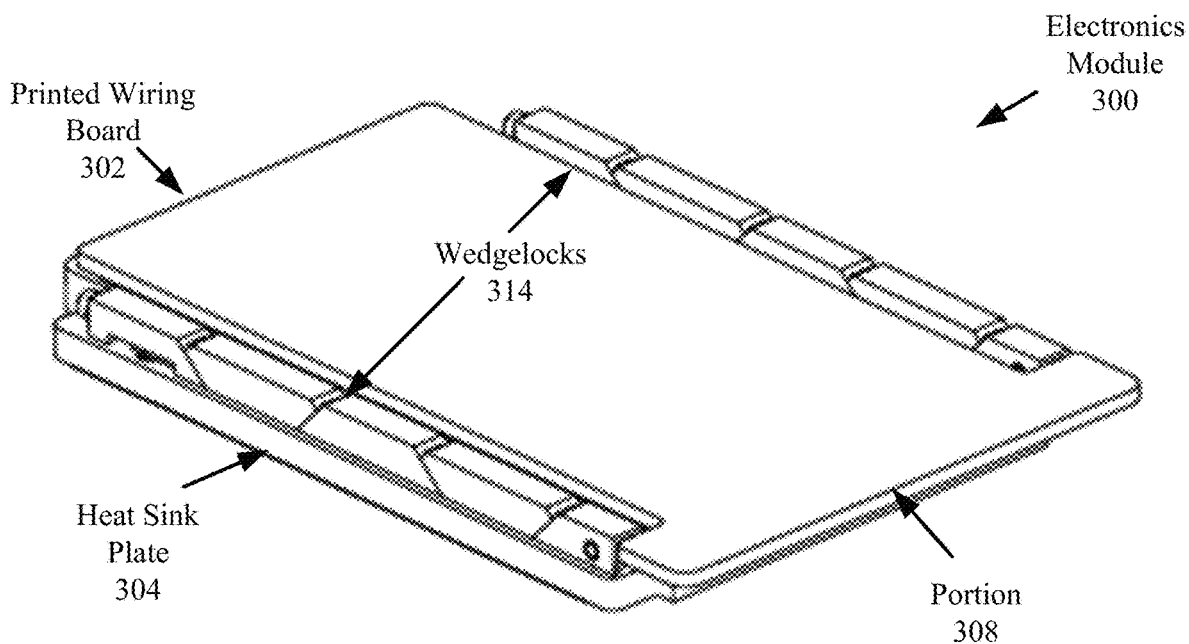
FIGS. 3A-3B (collectively referred to as FIG. 3) provide top and bottom perspective views of an illustrative electronic module implementing the present solution.
Figure 3B:
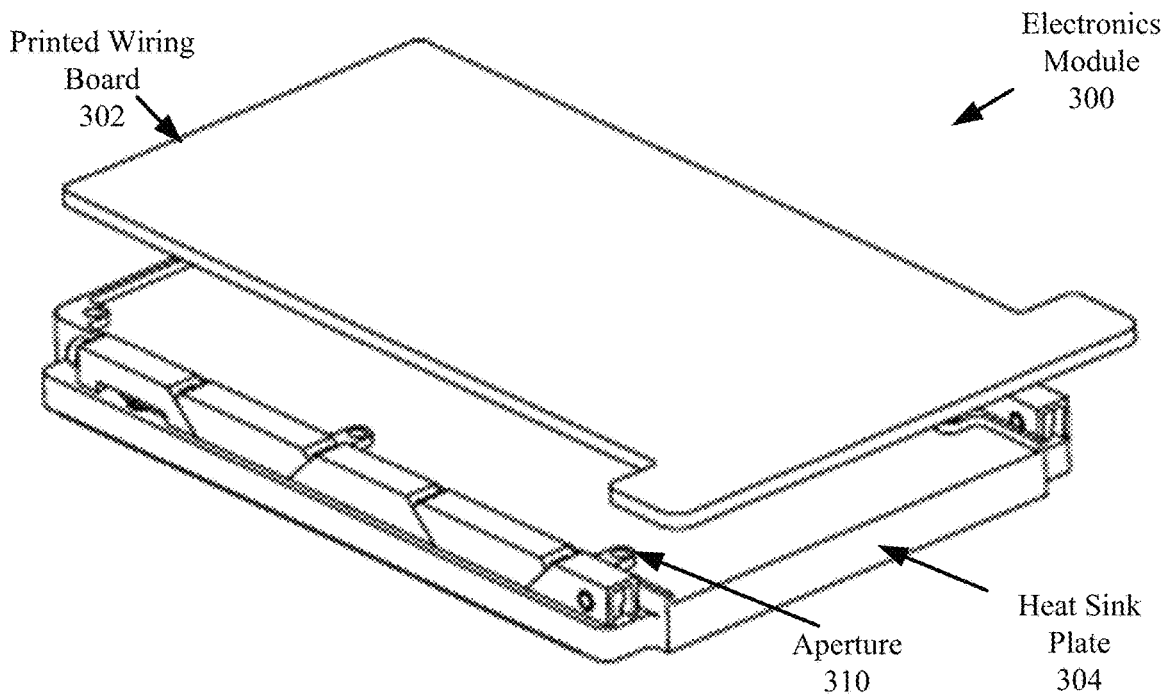
Figure 4:
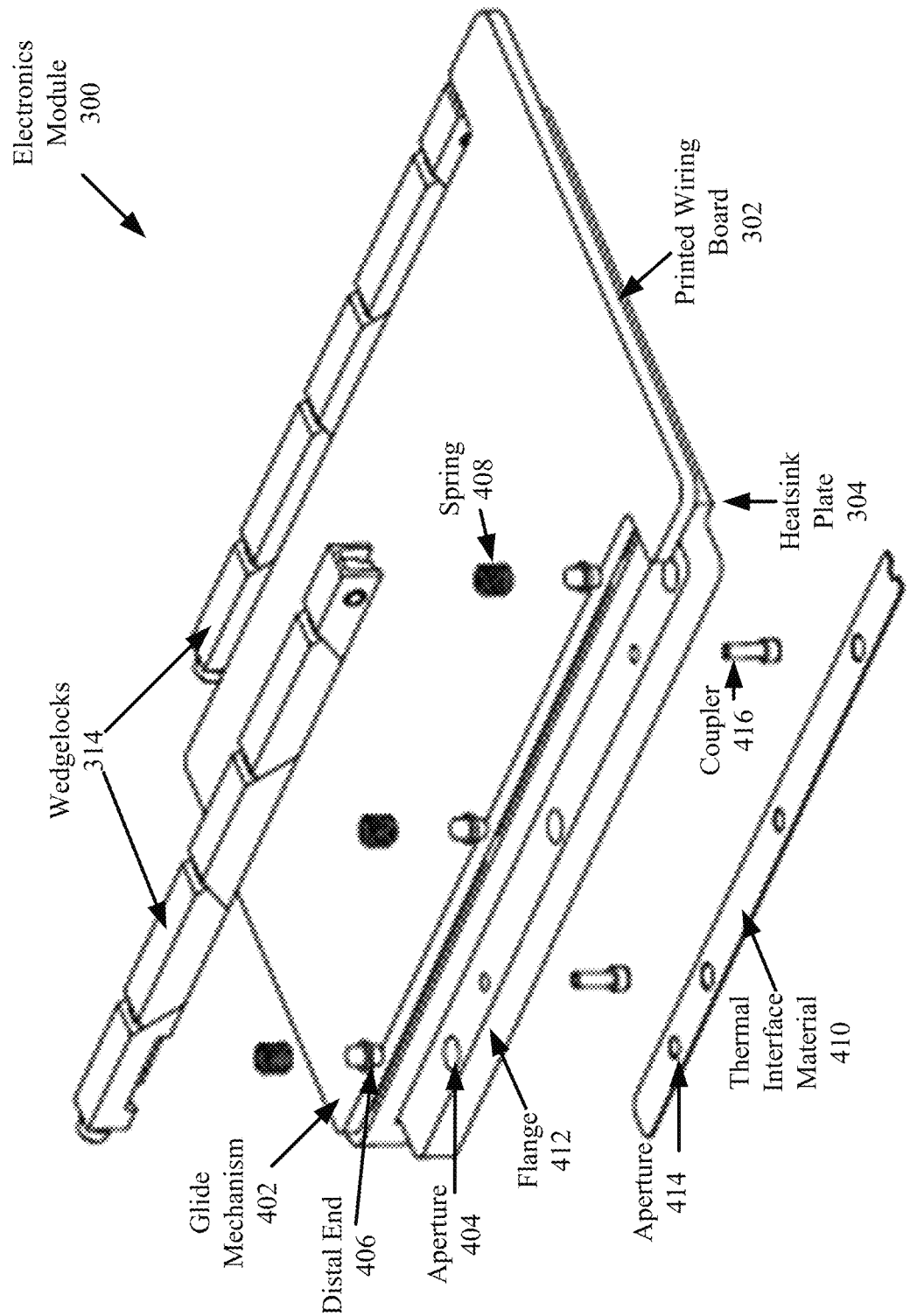
FIGS. 4-9 provide additional illustrations that are useful for understanding the electronic module of FIG. 3.

As shown in FIGS. 3-4, the electronic module 300 comprises a PWB 302 and a heatsink plate 304. The PWB 302 is coupled to the heatsink plate 304 via mechanical couplers (not shown) (e.g., screws engaging threaded apertures 310 formed in the heatsink plate). The PWB 302 has a plurality of electronic components (not shown) coupled thereto, traces (not shown) formed thereon, and/or vias (not shown) formed therethrough. The electronic components can include, but are not limited to, active components (e.g., processors and Integrated Circuit ("IC") chips) and passive components (e.g., resistors, capacitors, inductors, etc.).

An electrical connector (not shown) may be coupled to portion 308 of the PWB 302. The electrical connector is provided for electrically connecting the PWB 302 to external circuitry (e.g., a power source). Electronic components and electrical connectors are well known in the art, and therefore will not be described herein. Any known or to be known electronic components and electrical connectors can be used herein without limitation.

Heatsinks are well known in the art, and therefore will not be described in detail herein. However, it should be noted that the heatsink plate 304 is a passive heat exchanger that transfers heat generated by the electronic components of the PWB 302 to a structure (e.g., structure 104 of FIG. 1) where it is dissipated into the ambient environment, thereby allowing regulation of the PWB 302 and/or structure temperature at desired levels. The heatsink plate 304 is designed to maximize its surface area that is to come in contact with the rails (e.g., rails 106 of FIG. 1 or 106₁, 106₂ of FIG. 2). In this regard, the heatsink plate 304 comprises flanges 412 for facilitating heat transfer to the structure.

Wedgelocks 314 are respectively coupled to the flanges 412 via couplers 416 (e.g., screws). Wedgelocks are well known in the art, and therefore will not be described herein. Any known or to be known wedgelock can be used herein without limitation. Still, it should be understood that the wedgelocks 314 provide a means to clamp the flanges 412 between two adjacent rails (e.g., rails 106₁, 106₁ of FIG. 2). In this regard, the wedgelocks 314 can be transitioned between an unengaged position in which a clamping force is not applied thereby to a heatsink plate to an engaged position in which a clamping force is applied thereby to the heatsink plate. The rails are also formed of a material capable of transferring heat across the primary and secondary heatsink-rail interfaces (e.g., interfaces 214, 216 of FIG. 2).

Figure 5:
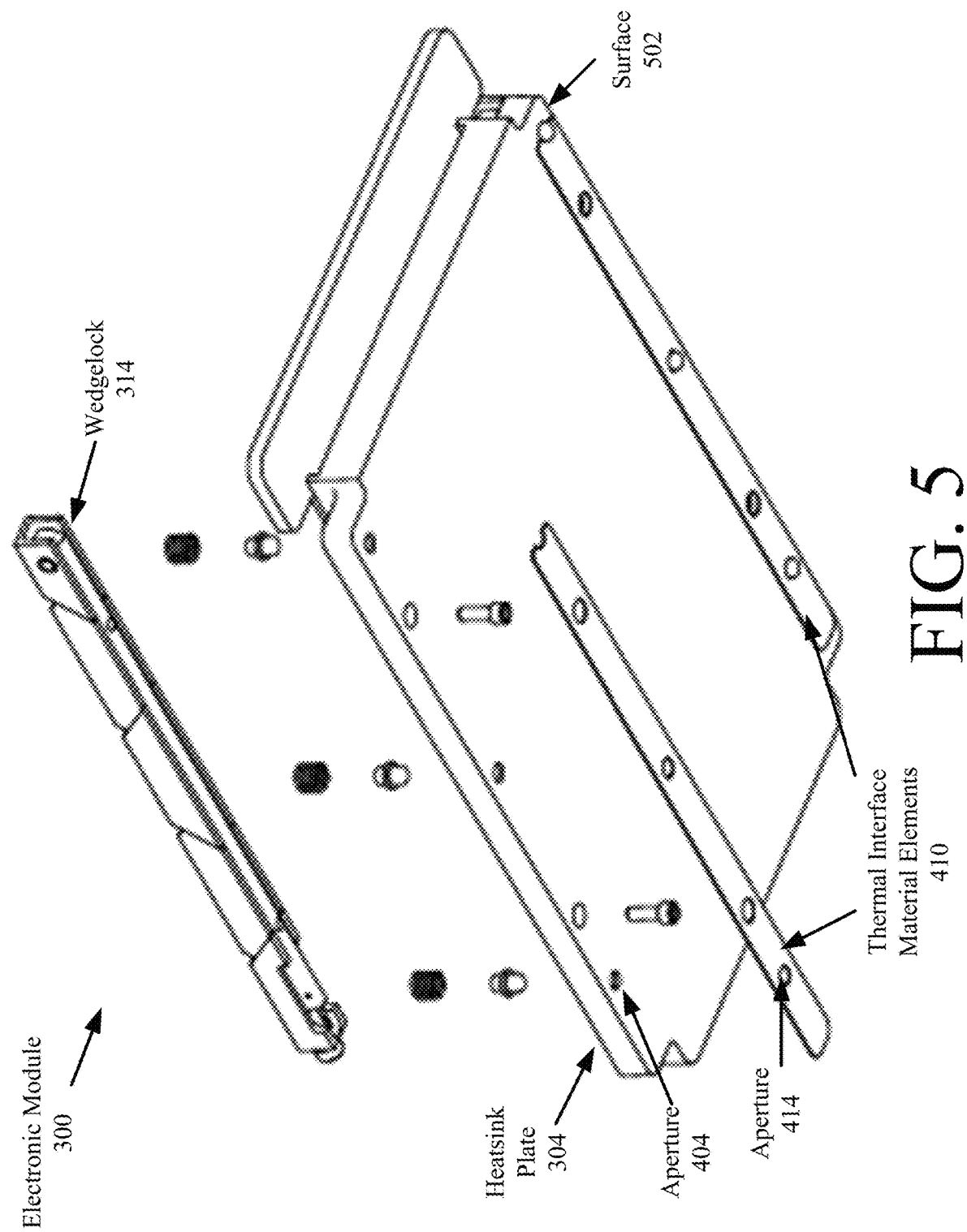
Figure 6:
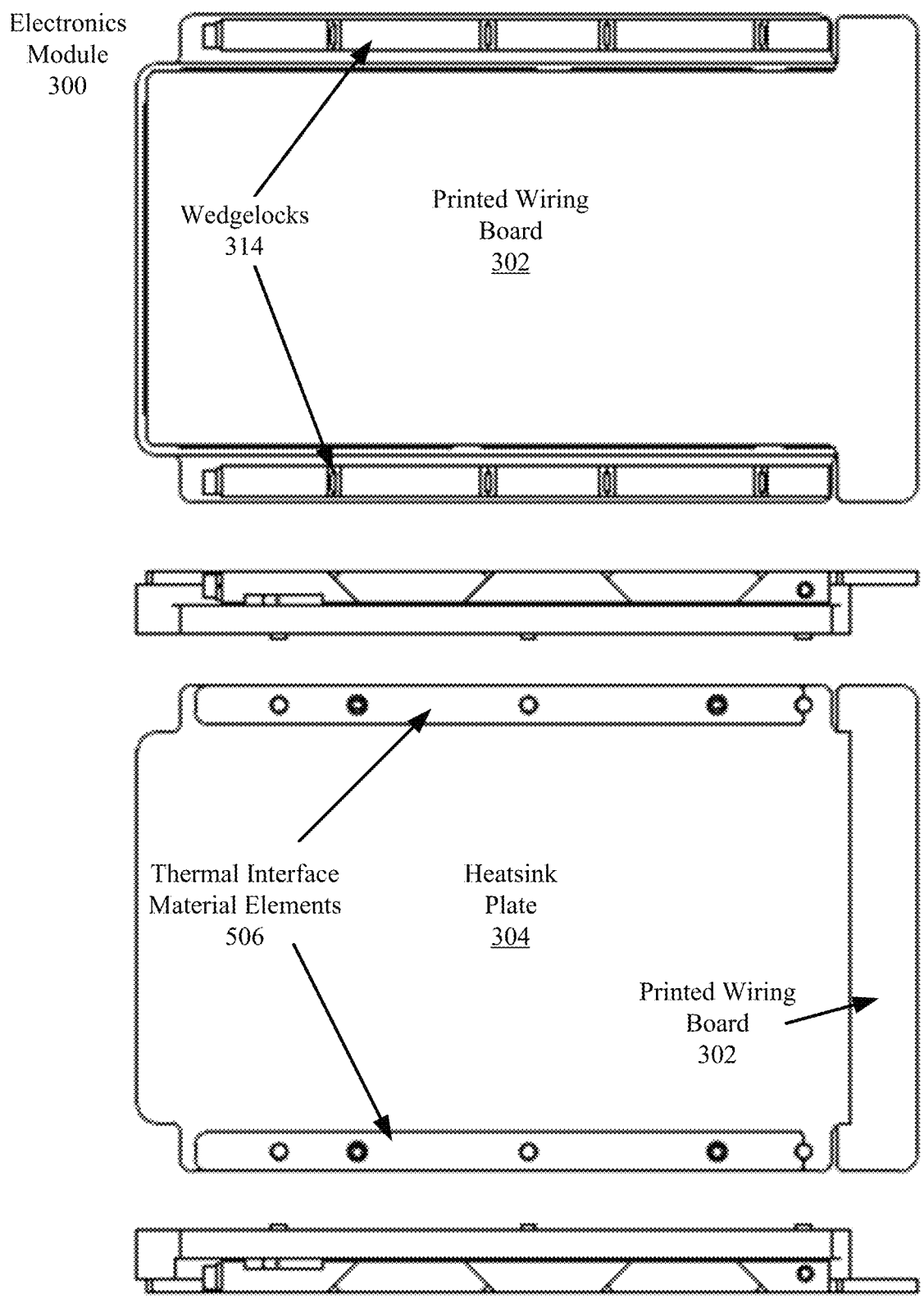

TIM elements 410 are coupled to the flanges 412 for improving the thermal resistance between the PWB 302 and the heatsink plate 304. More particularly, the TIM elements 410 are coupled to the flanges' lower surfaces 502 via an adhesive or some other means of attachment (e.g., wedgelocks 314 which could provide the retention, i.e., it is not a requirement that the TIM be adhered to the heatsink flanges but doing so supports system producibility and simplified integration at the next level of assembly). The TIM elements 410 are designed to maximize their surface areas that are to come in contact with the rails (e.g., rails 106 of FIG. 1 or 106₁, 106₂ of FIG. 2). In some scenarios, only one TIM element is provided on each flange. In this case, the TIM elements 410 have generally elongated linear shapes as shown in FIGS. 4-5. The present solution is not limited in this regard. One or more TIM elements can be provided on each flange, and the TIM elements can have any shapes or sizes selected in accordance with a particular application.

The TIM elements 410 include, but are not limited to, Indium, an elastomer, phase changing material, a metallic material, and/or a composite material. The TIM elements 410 compress and deform when a compression force is applied thereto (e.g., when the wedgelocks 314 are engaged so as to clamp the PWB 302 between itself and a rail), whereby an interstitial bridge is provided between the abutting heatsink plate and rail surfaces. This TIM element arrangement overcomes microscopic discontinuities in the surfaces of the heatsink plates 304 and rails. As a result, the thermal resistance now becomes a factor of only the wedgelock contact pressure and the inherent properties of the TIM itself when subjected to said pressure.

The TIM elements 410 can generate foreign object debris when motion in the shear plane of the TIM elements occurs. As such, the present solution advantageously employs one or more glide mechanisms 402 for providing protection to the TIM elements 410 while the electronic module 300 is being inserted into a structure, extracted from a structure, and/or otherwise moving within the structure. This method prevents the TIM elements 410 from generating foreign object debris in the structure.

Figure 9:
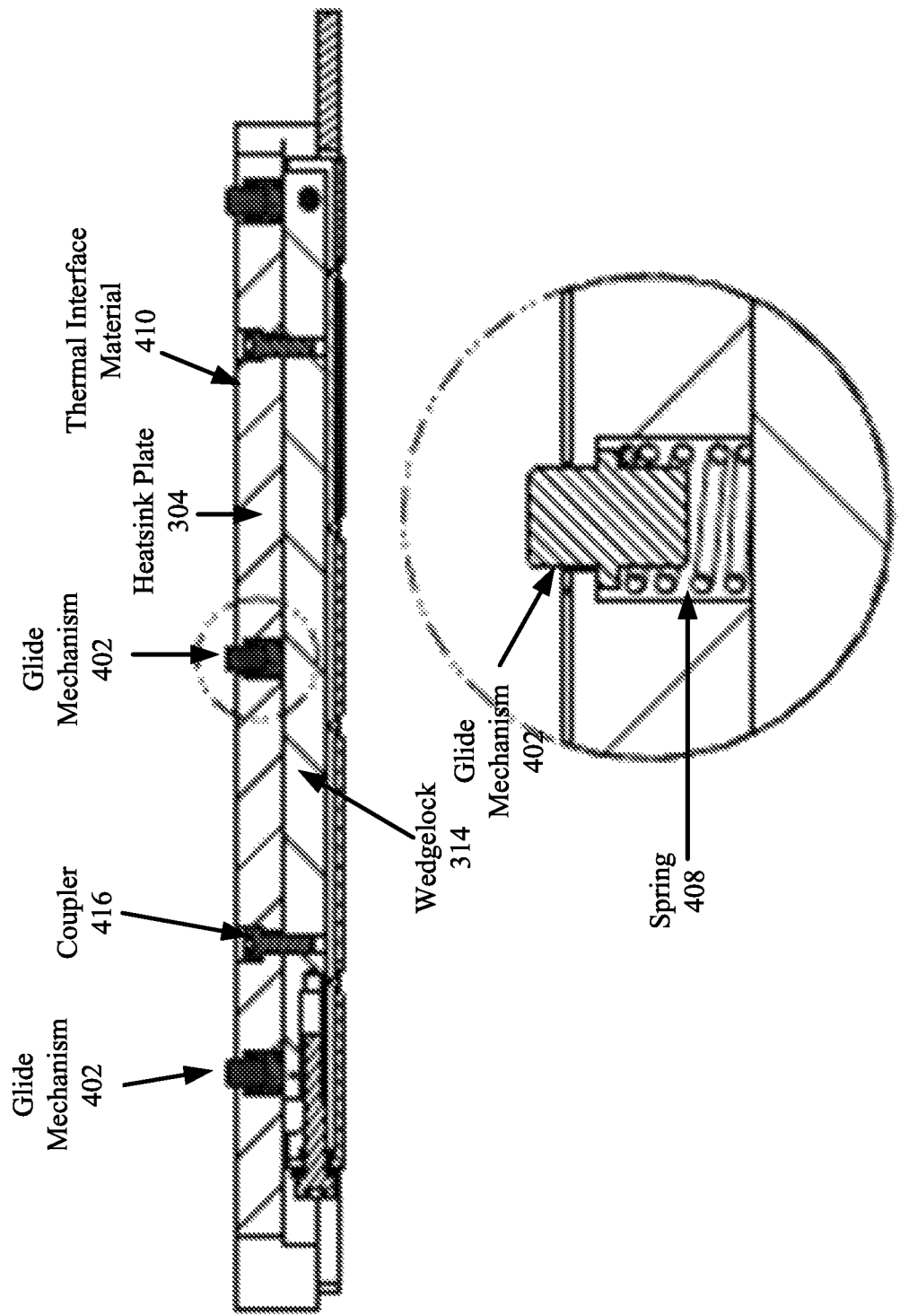
Figure 10A:
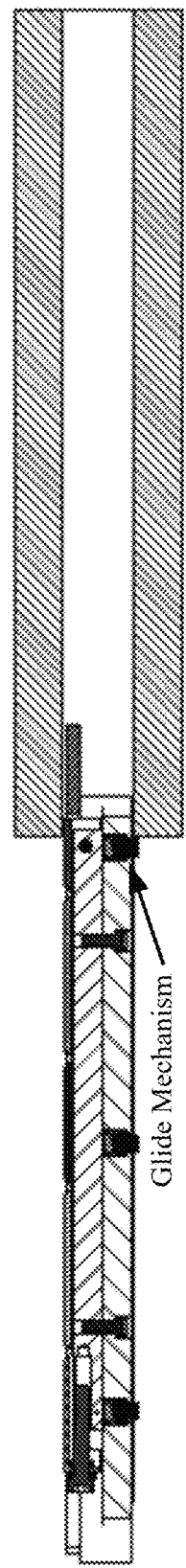
FIGS. 10A-10D (collectively referred to as FIG. 10) provide illustrations showing the electronic module of FIGS. 3-9 being inserted between two adjacent rails of a structure.
Figure 10B:
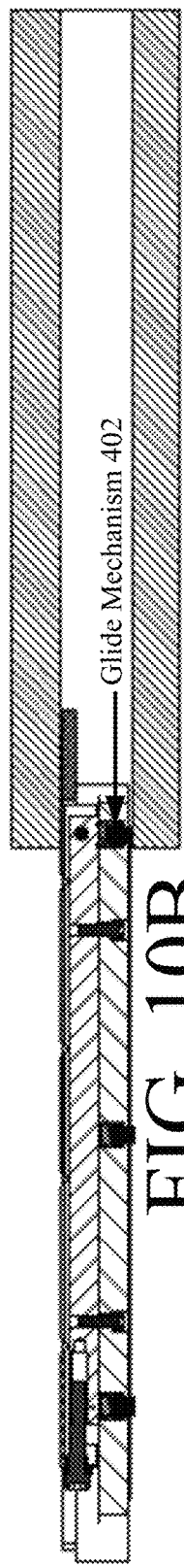
Figure 10C:
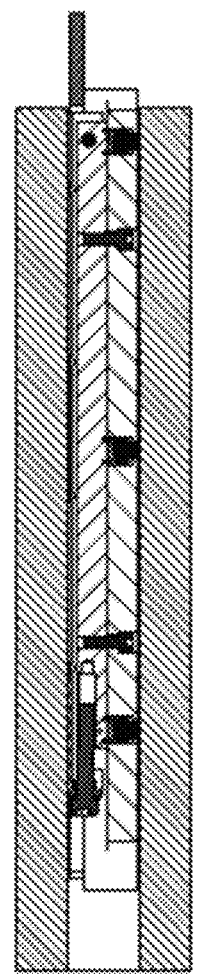
Figure 10D:
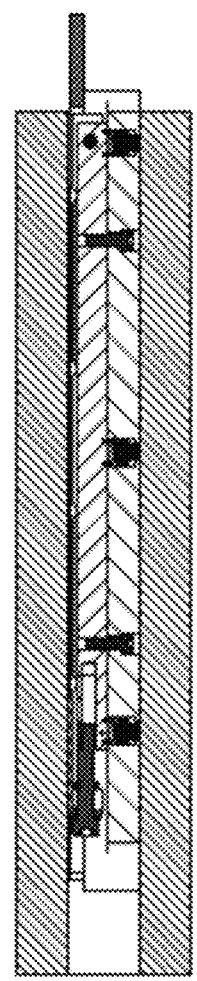

The glide mechanisms 402 are integrated into the flanges 412 of the heatsink plate 304. In this regard, apertures 404 are formed in the flanges 412 that are each sized and shaped to receive a respective glide mechanism 402. Apertures 414 are also formed in the TIM elements 410 that are each sized and shaped to receive a respective glide mechanism 402. Each glide mechanism 402 is spring-loaded such that it is resiliently biased in a downward direction away from the wedgelocks 314. The wedgelocks 314 facilitate the retention and captivation of the glide mechanisms 402 in the apertures 404, 414. The springs 408 of the glide mechanisms 402 are normally in an uncompressed state. Accordingly, each glide mechanism 402 is capable of transition between an undepressed position and a depressed position. In the undepressed position, a distal end 406 of the glide mechanism 402 protrudes out from the apertures 404, 414 in a direction away from the TIM elements 410, as shown in FIG. 9 and FIG. 10A. In the depressed position, each glide mechanism 402 is retracted into the electronic module 300 such that the distal ends thereof no longer protrude out of the apertures 404, 410, as shown in FIGS. 10B-10C.

The glide mechanisms 402 include, but are not limited to, spring-loaded plungers, spring-loaded ball bearing mechanisms, leaf spring mechanisms, and/or any other compressible mechanism. An illustration of a glide mechanism 700 comprising a spring-loaded plunger is provided in FIG. 7. An illustration of a glide mechanism 800 comprising a spring-loaded ball bearing mechanism is provided in FIG. 8. Both illustrative glide mechanisms are designed to: prevent the TIM elements 410 from sliding against the rails while the electronic module 300 is being inserting into and extracted from the structure; provide a means for sliding across the rails while the electronic module 300 is being inserted into and extracted from the structure; allow the TIM elements 410 to come in direct contact with the rails when the wedgelocks 314 are actuated for clamping the electronic module between two adjacent rails of a structure; and allow the TIM elements 410 to be reusable.

Figure 7:
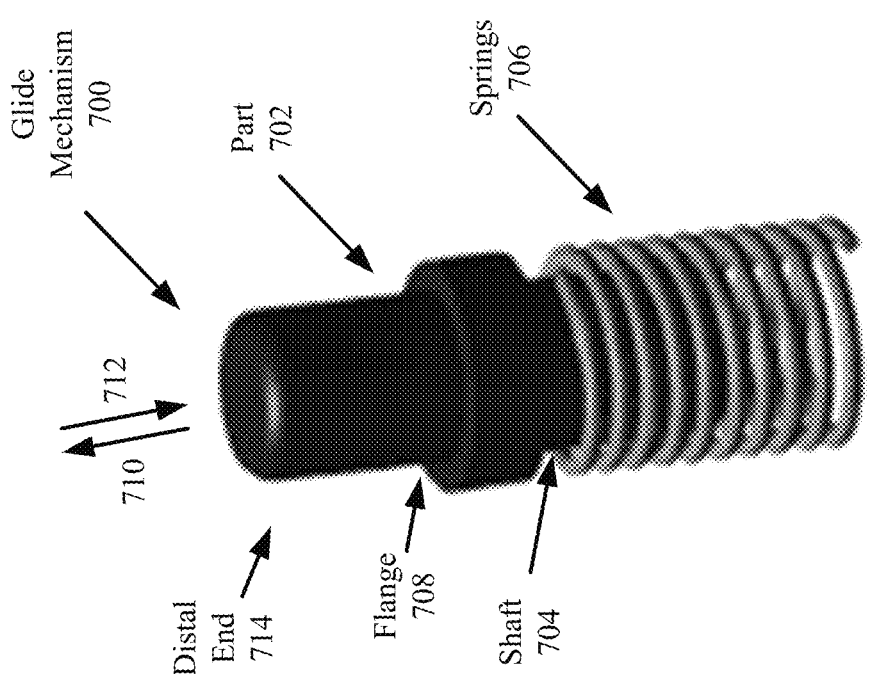

As shown in FIG. 7, the glide mechanism 700 comprises a part 702 having a shaft 704 on which a spring 706 is disposed. The part is provided with a flange 708 having a diameter greater than the diameter of the spring 706. The flange 708 provides a means for the part 702 to engage the spring 706 when depressed in a first direction 712. Such engagement causes compression of the spring 706 in the first direction 712. When the part 702 is released (i.e., is no longer being depressed), the spring 706 resiliently biases the part 702 in a second opposite direction 710. In this way, the glide mechanism 700 automatically transitions between a depressed position and an undepressed position.

The part 702 is formed of any suitable material, such as a thermoplastic or other durable material that is able to withstand wear or damage when slid against the rails a number of times. In some scenarios, a layer or coating (not shown) is disposed on the distal end 714 that has a relatively low coefficient of friction to facilitate an insertion and extraction of an electronic module from a structure with a relatively small amount of effort. The layer or coating includes, but is not limited to, Polytetrafluoroethylene, PTFE, or any number of non-stick derivatives. A typical coating of PTFE, commonly referred to by its well-known brand name Teflon™, could be used in this application.

Also, the spring 706 is an interchangeable component. In this regard, the spring 706 can be interchanged with another spring having the same form factor but different stiffness. Such spring interchangeability allows the glide mechanism to be customized to any given application so that a desired sliding force or resistance is achieved.

Figure 8:
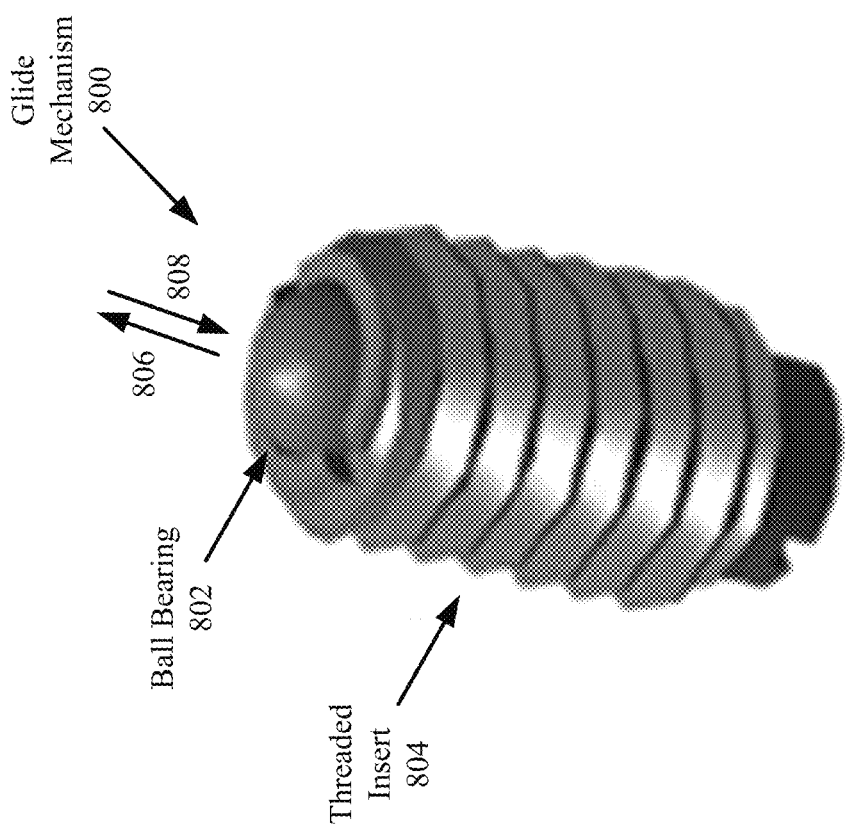

As shown in FIG. 8, the glide mechanism 800 comprises a Commercial Off The Shelf ("COTS") ball bearing based mechanism. More particularly, the glide mechanism 800 comprises a ball bearing 802 captivated in a threaded insert 804. A spring (not shown in FIG. 8) is also captured within the threaded insert 804 below the ball bearing 802. The spring resiliently biases the ball bearing 802 in a first direction 806. When a pushing force is applied to the ball bearing 802, it travels in a second opposing direction 808, and thereby retracts into the threaded insert 804. The spring automatically causes the ball bearing to return to its unretracted position when the pushing force is no longer being applied to the ball bearing.

The present solution is not limited to the particular implementation discussed above in relation to FIGS. 3-10. In other scenarios, the wedgelocks and TIM elements are mounted directly to the PWB rather than the heatsink plate. The heatsink plate is an optional component here. In yet other scenarios, the TIM elements 506 and glide mechanisms 402 are coupled to the rails rather than the electronic module.

Figure 11:
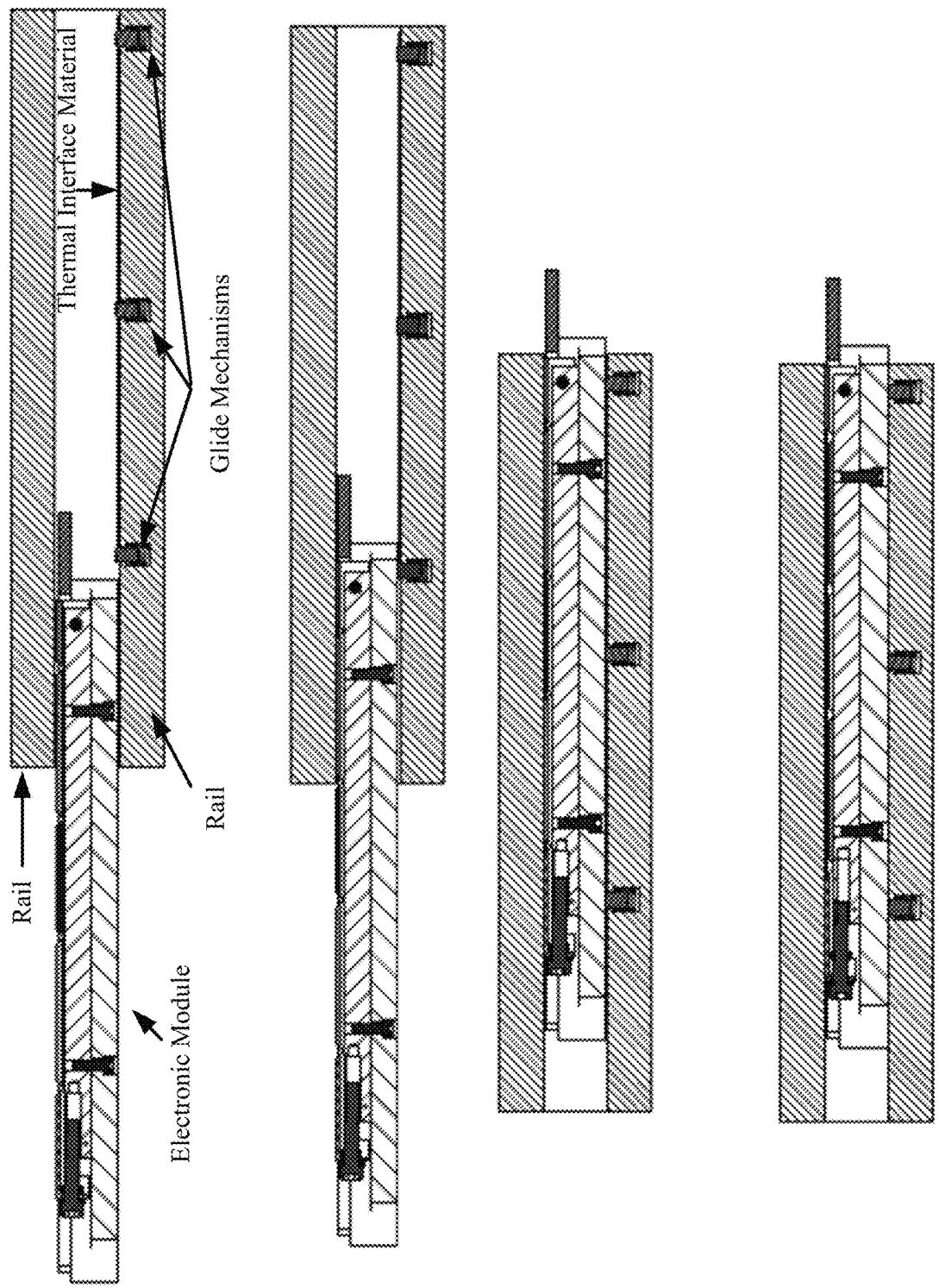
FIG. 11 provides illustrations showing an illustrative structure implementing the present solution.

Illustrations showing a TIM element and glide mechanisms coupled to a rail are provided in FIG. 11. In this scenario, the glide mechanisms can have multiple purposes. For example, the glide mechanisms are configured to: facilitate an improvement in the thermal resistance at the heatsink-rail interface(s); and/or facilitate the transfer of heat at the heatsink-rail interface (e.g., interface 214 of FIG. 2).

Figure 12:
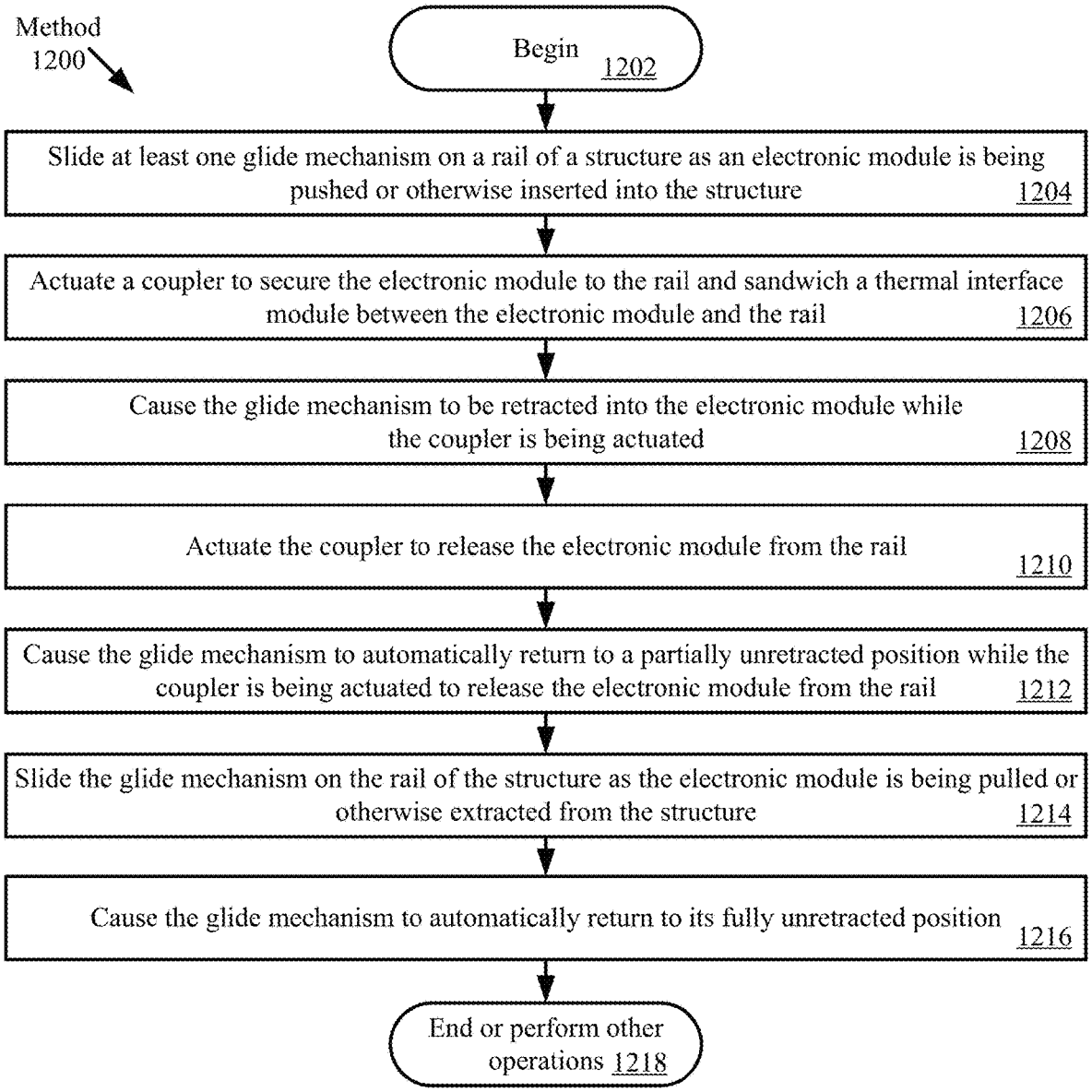
FIG. 12 is a flow diagram of an illustrative method for inserting and extracting an electronic module in/from a structure comprising rails.

Referring now to FIG. 12, there is provided a flow diagram of an illustrative method 1200 for inserting and extracting an electronic module (e.g., electronic module 102 of FIG. 1-2, or 300 of FIG. 3) in/from a structure comprising rails (e.g., rails 106 of FIGS. 1-2). Method 1200 begins with 1202 and continues with 1204 where at least one glide mechanism (e.g., glide mechanism 402 of FIG. 4, 700 of FIG. 7, or 800 of FIG. 8) is slid on a rail of the structure while the electronic module is being pushed or otherwise inserted into the structure. The glide mechanism is integrated with the electronic module, and is resiliently biased in a direction away from the electronic module to partially extend out from the electronic module in a direction towards the rail while being slid along the rail. Next in 1206, a coupler (e.g., wedgelock 202 of FIG. 2 or 314 of FIG. 3) is actuated to secure the electronic module to the rail and sandwich a thermal interface material (e.g., TIM 506 of FIG. 5) between the electronic module and the rail. Retraction of the glide mechanism into the electronic module is caused while the coupler is being actuated, as shown by 1208. During the insertion process, the thermal interface material first comes in contact with the rail while the coupler is being actuated.

Operations of 1210-1216 are performed for extracting the electronic module from the structure. These operations involve: actuating the coupler to release the electronic module from the rail; causing the glide mechanism to automatically return to a partially unretracted position (e.g., the position shown in FIG. 10C); slide the glide mechanism on the rail of the structure as the electronic module is being pulled or otherwise extracted from the structure; and cause the glide mechanism to return to its fully unretracted position. Subsequently, 1218 is performed where method 1200 ends or other processing is performed.

All of the apparatus, methods, and algorithms disclosed and claimed herein can be made and executed without undue experimentation in light of the present disclosure. While the invention has been described in terms of preferred embodiments, it will be apparent to those having ordinary skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those having ordinary skill in the art are deemed to be within the spirit, scope and concept of the invention as defined.

The features and functions disclosed above, as well as alternatives, may be combined into many other different systems or applications. Various presently unforeseen or unanticipated alternatives, modifications, variations or improvements may be made by those skilled in the art, each of which is also intended to be encompassed by the disclosed embodiments.

We claim:

1. A method for inserting an electronic module in a structure, comprising:
sliding at least one glide mechanism on a rail of the structure as the electronic module is being pushed into the structure, the at least one glide mechanism at least partially disposed in a heatsink plate of the electronic module and resiliently biased in a direction away from the electronic module to partially extend out (i) from a first side of the electronic module on which a thermal interface material is disposed and (ii) in a direction towards the rail;
actuating a coupler to secure the electronic module to the rail and sandwich the thermal interface material between the first side of the electronic module and the rail; and
causing the at least one glide mechanism to be retracted into the first side of the electronic module while the coupler is being actuated;
wherein a portion of the at least one glide mechanism extends directly between the thermal interface material and the rail during the sliding and prevents the thermal interface material from directly contacting the structure during the sliding; and
wherein the thermal interface material first comes in contact with the rail while the coupler is being actuated.

2. The method according to claim 1, wherein the heatsink plate is coupled to a circuit board, and the at least one glide mechanism is integrated in the heatsink plate.

3. The method according to claim 1, wherein the coupler facilitates capturing of the at least one glide mechanism in an aperture formed in the heatsink plate.

4. The method according to claim 1, wherein the at least one glide mechanism comprises a resiliently biased plunger, a resiliently biased ball bearing, or another assembly capable of providing spring-related performance.

5. The method according to claim 1, wherein the coupler is a wedgelock.

6. A method for inserting an electronic module in a structure, comprising:
sliding at least one glide mechanism on a rail of the structure as the electronic module is being pushed into the structure, the at least one glide mechanism integrated with the electronic module and resiliently biased in a direction away from the electronic module to partially extend out from the electronic module in a direction towards the rail;
actuating a coupler to secure the electronic module to the rail and sandwich a thermal interface material between the electronic module and the rail; and
causing the at least one glide mechanism to be retracted into the electronic module while the coupler is being actuated;
wherein the thermal interface material first comes in contact with the rail while the coupler is being actuated;
wherein the thermal interface material is coupled to the electronic module and the at least one glide mechanism extends through the thermal interface material during the sliding.

7. The method according to claim 6, wherein the at least one glide mechanism is further retracted into the thermal interface material while the coupler is being actuated.

8. A method for inserting an electronic module in a structure, comprising:
sliding at least one glide mechanism on a surface of the electronic module as the electronic module is being pushed into the structure, the at least one glide mechanism coupled to a rail of the structure and resiliently biased in a direction away from the rail so as to partially extend out from the rail in a direction towards the electronic module;
actuating a coupler to secure the electronic module to the rail and sandwich a thermal interface material between the electronic module and the rail; and
causing the at least one glide mechanism to be retracted into the rail while the coupler is being actuated;
wherein the thermal interface material is disposed on the rail and first comes in contact with the electronic module while the coupler is being actuated; and
wherein the glide mechanism comprises a resiliently biased plunger or a resiliently biased ball bearing that at least partially extends through the thermal interface material during the sliding.

9. The method according to claim 8, wherein the thermal interface has dual purposes of (a) facilitating an improvement in a thermal resistance at an interface between the electronic component and the rail and (b) facilitating a transfer of heat from the electronic component to the structure at the interface.

10. An electronic module, comprising:
a planar electronic component;
a thermal interface material coupled to the planar electronic component; and
at least one glide mechanism integrated with the planar electronic component at a location where the thermal interface material resides;
wherein the at least one glide mechanism extends through the thermal interface material at certain times such that the thermal interface material is prevented from generating foreign object debris when the electronic module is being inserted into or extracted from a structure.

11. The electronic module according to claim 10, wherein the at least one glide mechanism is slid on a rail of the structure as the electronic module is being pushed into the structure, and the at least one glide mechanism is resiliently biased in a direction away from the electronic module so as to partially extend out from the electronic module in a direction towards the rail.

12. The electronic module according to claim 10, further comprising a coupler secured to the planar electronic component and configured to facilitate a securement of the electronic module to a rail of the structure.

13. The electronic module according to claim 12, wherein the coupler is further configured to cause the thermal interface material to be sandwiched between the electronic module and the rail when the electronic module is secured to the rail.

14. The electronic module according to claim 12, wherein retraction of the at least one glide mechanism into the electronic module is caused while the coupler is being actuated for securing the electronic module to the rail.

15. The electronic module according to claim 12, wherein the thermal interface material first comes in contact with the rail while the coupler is being actuated for securing the electronic module to the rail.

16. The electronic module according to claim 10, wherein the planar electronic component comprises a heatsink plate, and the at least one glide mechanism is integrated in the heatsink plate.

17. An electronic module, comprising:
a planar electronic component;
a thermal interface material coupled to the planar electronic component; and
at least one glide mechanism integrated with the planar electronic component at a location where the thermal interface material resides;
wherein the at least one glide mechanism prevents the thermal interface material from generating foreign object debris when the electronic module is being inserted into or extracted from a structure; and
wherein the at least one glide mechanism extends through the thermal interface material while being slid on a rail of the structure.

18. An electronic module, comprising:
a planar electronic component;
a thermal interface material coupled to the planar electronic component; and
at least one glide mechanism integrated with the planar electronic component at a location where the thermal interface material resides;
wherein the at least one glide mechanism prevents the thermal interface material from generating foreign object debris when the electronic module is being inserted into or extracted from a structure; and
wherein the at least one glide mechanism is retracted into the thermal interface material while the electronic module is being secured to the structure.

19. The method according to claim 18, wherein the at least one glide mechanism comprises a resiliently biased plunger, a resiliently biased ball bearing, or another assembly capable of providing spring-related performance.

\* \* \* \* \*